United States Patent
Takano et al.

(10) Patent No.: US 10,115,674 B2
(45) Date of Patent: Oct. 30, 2018

(54) SEMICONDUCTOR DEVICE INCLUDING ELECTROMAGNETIC INTERFERENCE (EMI) SHIELDING LAYER AND METHOD FOR MANUFACTURING THE SEMICONDUCTOR DEVICE

(71) Applicant: Toshiba Memory Corporation, Tokyo (JP)

(72) Inventors: Yuusuke Takano, Yokkaichi Mie (JP); Takeshi Watanabe, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 71 days.

(21) Appl. No.: 15/233,915

(22) Filed: Aug. 10, 2016

(65) Prior Publication Data

US 2017/0077040 A1 Mar. 16, 2017

(30) Foreign Application Priority Data

Sep. 11, 2015 (JP) ................................. 2015-179997

(51) Int. Cl.
*H01L 21/28* (2006.01)
*H01L 21/32* (2006.01)
(Continued)

(52) U.S. Cl.
CPC ...... *H01L 23/552* (2013.01); *H01L 21/02244* (2013.01); *H01L 21/02247* (2013.01);
(Continued)

(58) Field of Classification Search
CPC .............. H01L 23/552; H01L 21/2855; H01L 21/32051; H01L 21/02247; H01L 23/481;
(Continued)

(56) References Cited

U.S. PATENT DOCUMENTS 6,811,662 B1 * 11/2004 Liu .......................... C23C 14/35
204/192.12
9,349,694 B2 5/2016 Shibuya et al.
(Continued)

FOREIGN PATENT DOCUMENTS

CN 101803017 A 8/2010
JP H09-213829 A 8/1997
(Continued)

OTHER PUBLICATIONS

TW Office Action dated Nov. 11, 2016 for Application No. 105106190.
(Continued)

*Primary Examiner* — Didarul Mazumder
(74) *Attorney, Agent, or Firm* — Patterson & Sheridan, LLP

(57) ABSTRACT

According to one embodiment, in a method for manufacturing a semiconductor device, a semiconductor chip is provided on a first surface of a substrate having the first surface, a second surface opposite to the first surface, and a side surface between the first surface and the second surface. A resin that seals the first surface of the semiconductor chip is formed on the semiconductor chip. A conductive film electrically connectable to a ground potential source is formed on an upper surface of the resin and a side surface of the resin. A metal oxide film or a metal nitride film is formed on the conductive film by depositing metal on the conductive film in an environment containing oxygen or nitrogen.

12 Claims, 5 Drawing Sheets

(51) Int. Cl.
  *H01L 21/02* (2006.01)
  *H01L 23/48* (2006.01)
  *H01L 21/56* (2006.01)
  *H01L 23/31* (2006.01)
  *H01L 23/552* (2006.01)
  *H01L 21/3205* (2006.01)
  *H01L 21/285* (2006.01)
  *H01L 23/00* (2006.01)
  *H01L 23/544* (2006.01)

(52) U.S. Cl.
  CPC .... *H01L 21/2855* (2013.01); *H01L 21/32051* (2013.01); *H01L 23/481* (2013.01); *H01L 23/544* (2013.01); *H01L 24/97* (2013.01); H01L 21/02252 (2013.01); H01L 21/561 (2013.01); H01L 23/3121 (2013.01); H01L 2223/54406 (2013.01); H01L 2223/54433 (2013.01); H01L 2223/54486 (2013.01); H01L 2224/32225 (2013.01); H01L 2224/48091 (2013.01); H01L 2224/48227 (2013.01); H01L 2224/73265 (2013.01); H01L 2224/97 (2013.01); H01L 2924/15313 (2013.01)

(58) Field of Classification Search
  CPC ............... H01L 21/02244; H01L 21/56; H01L 23/3107; H01L 21/02252; H01L 23/544; H01L 24/97; H01L 21/561; H01L 23/3121; H01L 2223/54406; H01L 2223/54433; H01L 2223/54486; H01L 2224/32225; H01L 2224/48
  USPC ........................................................ 257/659
  See application file for complete search history.

(56) References Cited

U.S. PATENT DOCUMENTS

| | | | |
|---|---|---|---|
| 2002/0064019 A1* | 5/2002 | Dobashi | C25D 1/04 361/302 |
| 2009/0002970 A1 | 1/2009 | Leahy et al. | |
| 2009/0199931 A1* | 8/2009 | Leuschner | C23C 2/02 148/277 |
| 2011/0070731 A1* | 3/2011 | Futase | H01L 21/02063 438/653 |
| 2014/0284775 A1 | 9/2014 | Nomura | |
| 2015/0171021 A1* | 6/2015 | Takano | H01L 24/97 257/659 |
| 2015/0314567 A1* | 11/2015 | Boger | C23C 2/06 428/612 |
| 2018/0108618 A1 | 4/2018 | Yamamoto et al. | |

FOREIGN PATENT DOCUMENTS

| | | |
|---|---|---|
| JP | 2014-189861 A | 10/2014 |
| JP | 2014-209544 A | 11/2014 |
| JP | 2015-056427 A | 3/2015 |
| JP | 2015-115552 A | 6/2015 |
| TW | 299487 B | 3/1997 |
| WO | 2014090561 | 6/2014 |
| WO | 2016/204208 A1 | 12/2016 |

OTHER PUBLICATIONS

Taiwanese Office Action dated Jun. 26, 2017, filed in Taiwanese Patent Application No. 105106190, 8 pages (with English translation).

Japanese Office Action dated Mar. 26, 2018, filed in counterpart Japanese Patent Application No. 2015-179997 (9 pages) (with Translation).

* cited by examiner

|  |  | Model resin | Cu/SUS | Cu/CuO/SUSO | Cu/SuS/CrO | Cu/SuS/CrO | Cu/SuS/TiAlN |
|---|---|---|---|---|---|---|---|
| 60 | SUSO(FeO,CrO,NiO)(μm) |  |  | 0.02 |  |  |  |
|  | CuO(μm) |  |  | 0.42 |  |  | 0.1 |
|  | CrO(μm) |  |  |  | 0.1 | 0.2 |  |
|  | SUS(μm) |  | 0.3 |  | 0.3 | 0.3 | 0.3 |
| 50 | Cu(μm) |  | 2.5 | 2.5 | 2.5 | 0.5 | 0.5 |
| COLOR DIFFERENCE METER (SCI) | L (WHITE 100, BLACK 0) | 29.60 | 73.53 | 28.43 | 50.57 | 57.47 | 28.85 |
| COLOR DIFFERENCE METER (SCE) | L (WHITE 100, BLACK 0) | 27.81 | 70.01 | 27.02 | 47.26 | 54.47 | 27.29 |
|  |  | (A) | (B) | (C) | (D) | (E) | (F) |

SEMICONDUCTOR DEVICE INCLUDING ELECTROMAGNETIC INTERFERENCE (EMI) SHIELDING LAYER AND METHOD FOR MANUFACTURING THE SEMICONDUCTOR DEVICE

CROSS-REFERENCE TO RELATED APPLICATION

This application is based upon and claims the benefit of priority from Japanese Patent Application No. 2015-179997, filed Sep. 11, 2015, the entire contents of which are incorporated herein by reference.

FIELD

Exemplary embodiments described herein relate to a method for manufacturing a semiconductor device and a semiconductor device.

BACKGROUND

In some cases, a semiconductor package includes a shield layer which is provided on a surface of a sealing resin of the semiconductor package in order to suppress electromagnetic interference (EMI) caused by electromagnetic noise. A protective film is provided on the surface of the shield layer which protects the shield layer. However, in the related art, the protective film is a metal film, and includes high lightness (L value) as compared with the lightness of the shielding resin. Accordingly, it is not easy to find defects (for example, scratches or the like) in the semiconductor package which includes the shield layer and the protective film during a visual inspecting step as compared with the semiconductor package of which the surface is formed of a resin and does not include the shield layer and the protective film. In addition, the protective film exhibits high lightness, and thus at the time of inspection, light is reflected on the semiconductor package including the shield layer and the protective film with high light reflectance. For this reason, operator's eyes are heavily fatigued in the visual inspection for the semiconductor package including the shield layer and the protective film.

DESCRIPTION OF THE DRAWINGS

FIG. 4 is a table illustrating a relationship between a material of a protective film and lightness (L value).

DETAILED DESCRIPTION

Embodiments provide a semiconductor device and a method for manufacturing the semiconductor device in which defects are easily found in the visual inspecting step.

In general, according to one embodiment, in a method for manufacturing a semiconductor device, a semiconductor chip is provided on a first surface of a substrate having the first surface, a second surface opposite to the first surface, and a side surface between the first surface and the second surface. A resin that seals the first surface of the semiconductor chip is formed on the semiconductor chip. A conductive film electrically connectable to a ground potential source is formed on an upper surface of the resin and a side surface of the resin. A metal oxide film or a metal nitride film is formed on the conductive film by depositing metal on the conductive film in an environment containing oxygen or nitrogen.

Hereinafter, the exemplary embodiment will be described with reference to the drawings. The exemplary embodiment is not limited to the present invention. In the exemplary embodiment described below, a vertical direction of the semiconductor device indicates a relative direction when a surface on which a semiconductor chip is mounted faces upward, and thus may be different from the vertical direction in accordance with the direction of acceleration of gravity.

Figure 1:
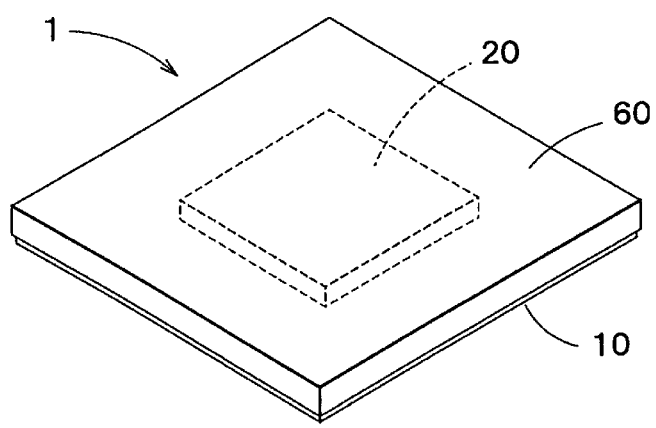
FIG. 1 is a perspective view illustrating an example of a configuration of a semiconductor device according to an exemplary embodiment.
Figure 2:
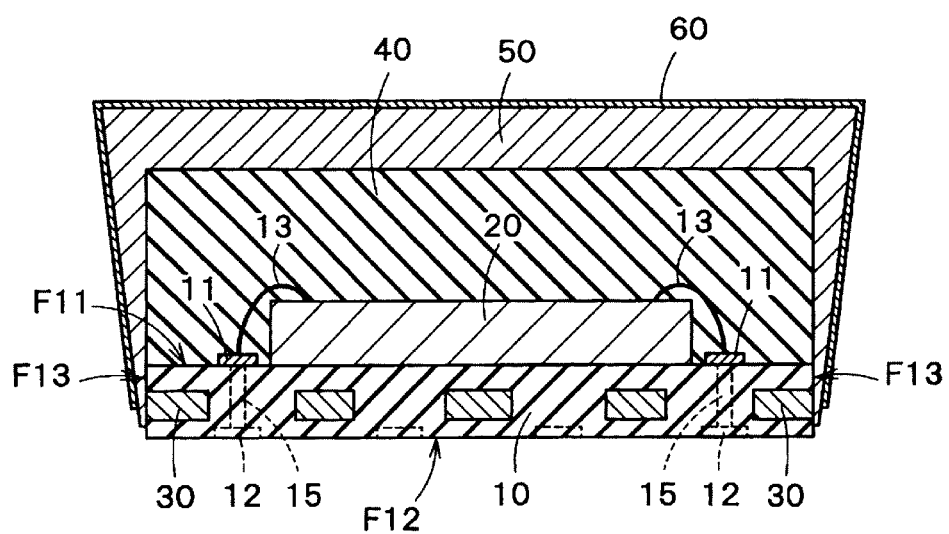
FIG. 2 is a sectional view illustrating an example of a configuration of the semiconductor device.

FIG. 1 is a perspective view illustrating an example of a configuration of a semiconductor device 1 according to the exemplary embodiment. FIG. 2 is a sectional view illustrating an example of a configuration of the semiconductor device 1.

The semiconductor device 1 includes a substrate 10, a semiconductor chip 20, a first terminal 30, a resin 40, a shielding film 50, and a protective film 60.

The substrate 10 may be, for example, a wiring substrate on which a wiring layer 11 and the like are provided on an insulating material such as a resin, a ceramic, and glass. The substrate 10 has a first surface F11, a second surface F12 formed on the side thereof opposite to the first surface F11, and a side surface F13 extending between the first surface F11 and the second surface F12. The substrate 10 includes the wiring layer 11 on the first surface F11, and a first terminal 30 which is formed between the first surface F11 and the second surface F12, that is, in a middle portion of the substrate 10. Although not shown, the substrate 10 may include a wiring on the second surface F12 as well.

The wiring layer 11 includes, for example, a signal wiring, a power wiring, and a ground wiring, and is electrically connected to any terminal of the semiconductor chip 20 via a metal wire 13. In addition, the wiring layer 11 may be electrically connected to, for example, an electrode pad 12 or a wiring (not shown) provided on the second surface F12 by a via 15.

The electrode pad 12 is provided on the second surface F12 so as to be connected to other substrates (not shown). In a case where a package of the semiconductor device 1 is a land grid array (LGA) type, the electrode pad 12 is a flat electrode. In a case of the package of the semiconductor device 1 is a ball grid array (BGA) type, a solder ball (not shown) is provided on the electrode pad 12. Note that the type of the package of the semiconductor device 1 is not limited thereto.

The first terminal 30 is provided on the side surface F13 of the substrate 10, and is electrically connected to the shielding film 50 on the side surface F13. The first terminal 30 is wired to be electrically connected to a grounding potential source when being mounted on another substrate.

Each of the respective wiring layer 11, the electrode pad 12, and the first terminal 30 may be a single-layer wiring, but each may be a stacked-layer wiring in which an insulating layer and a conductive layer are stacked on each other without being limited to the single-layer wiring. As for the conductive layer of each of the wiring layer 11, the electrode pad 12, and the first terminal 30, conductive materials such as copper, silver, gold, and nickel are used.

The semiconductor chip 20 is mounted on the first surface F11 of the substrate 10 with an adhesive (not shown). The semiconductor chip 20 is electrically connected to the wiring 11 or the like of the substrate 10 via the metal wire 13. The semiconductor chip 20 includes a semiconductor element which is provided on the semiconductor substrate. The semiconductor chip 20 may be a stacked body including a plurality of semiconductor chips. For example, when the semiconductor device 1 is an NAND-type electrically erasable programmable read-only memory (EEPROM), the semiconductor chip 20 may be a stacked body obtained by stacking a plurality of memory chips.

The resin portion 40 is provided on the front surface and the side surface of the semiconductor chip 20, and the first surface F11 of the substrate 10 in order to seal and protect the semiconductor chip 20, wiring 11, and the metal wire 13. As for the resin portion 40, for example, an epoxy resin containing carbon black or the like may be used. The resin portion 40 is later subjected to a dicing process together with the substrate 10, and thus the side surface of the resin portion 40 is substantially flush with the side surface F13 of the substrate 10. In addition, product information such as product numbers, manufacture date, and a manufacturing plant is marked on the upper surface of the resin portion 40 by irradiation thereof with a laser.

The shielding film 50 as the conductive film is provided on at least a portion of the front surface and the side surface of the resin portion 40, and the side surface F13 of the substrate 10. As for the shielding film 50, for example, low resistance conductive materials such as copper, silver, and nickel are used. The shielding film 50 is electrically connected to the first terminal 30 which is provided on the side surface F13 of the substrate 10. Thereby, when the semiconductor device 1 is mounted on another substrate such as a printed circuit board and the first terminal 30 is connected to the grounding potential source, the shielding film 50 is electrically connected to the grounding potential source through the first terminal 30. The shielding film 50 leads electromagnetic noise to the ground potential source. Thereby, the shielding film 50 prevents electromagnetic noise caused by the semiconductor chip 20 from being leaked to the outside of the semiconductor device 1. Alternatively, shielding film 50 prevents electromagnetic noise from the outside of the semiconductor device 1 from entering the inside of the semiconductor device 1. For example, when the semiconductor device 1 is used as electronic devices such as a portable terminal for performing communication, the shielding film 50 can prevent electromagnetic energy from the semiconductor device 1 from causing the EMI, or prevent unintended action of the semiconductor device 1 due to the electromagnetic noise.

The protective film 60 is provided on the upper surface and the side surface of the shielding film 50. The protective film 60 covers the upper surface and the side surface of the shielding film 50 in order to protect the shielding film 50 from scratches and corrosion. The protective film 60 is provided on the outermost side of the semiconductor device 1. The protective film 60 uses, for example, at least one of materials such as copper oxide, chromium oxide, iron oxide, nickel oxide, and titanium aluminum nitride.

Here, the appearance of the protective film 60 will be described.

Figure 3A:
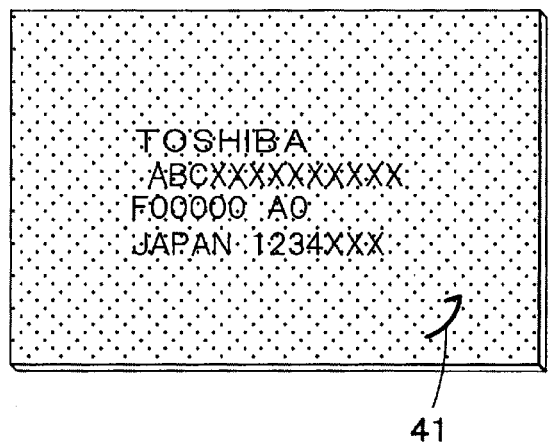
FIG. 3A and FIG. 3B are top views of an appearance of the semiconductor device as viewed from above.
Figure 3B:
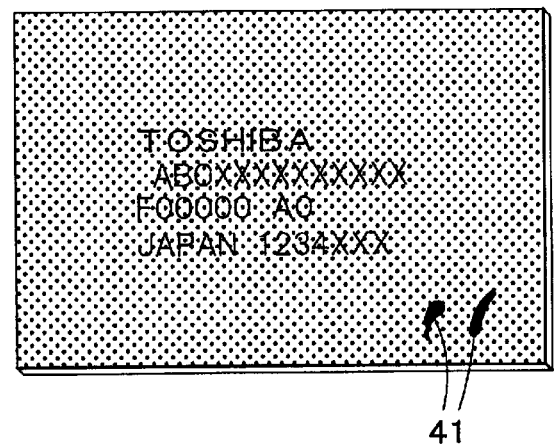

FIG. 3A and FIG. 3B are top views of the appearance of the semiconductor device as viewed from above. That is, FIG. 3A and FIG. 3B illustrate the appearance of the protective film provided on the outermost surface of the semiconductor device.

The semiconductor device as illustrated in FIG. 3A includes a shielding film formed of copper and a protective film formed of stainless steel (SUS). The stainless steel has relatively high lightness (L value) and reflectance. In appearance, the stainless steel is substantially silver-colored. As such, in a case of the high lightness, it is not easy to find scratches, corrosion, dirt, or the like 41 which exist on the protective film in the visual inspecting step. In addition, the visual inspection is performed by the naked eye of an operator through a microscope or the like. Therefore, in a case of strongly reflected light from the protective film, it is likely to fatigue the operator's eye.

In contrast, the semiconductor device 1 as illustrated in FIG. 3B includes the shielding film 50 formed of copper and the protective film 60 formed of chromium oxide ($Cr_2O_3$). The lightness (L value) of the chromium oxide is lower than that of the stainless steel. In appearance, the chromium oxide is substantially dark gray colored. As such, in a case of the relatively low lightness, it is easy to find scratches, corrosion, dirt, or the like 41 which exist on the protective film in the visual inspecting step. In addition, it is less likely to fatigue the operator's eye.

FIG. 4 is a table illustrating a relationship between a material of a protective film 60 and lightness (L value). The lightness of the protective film 60 is determined based on the L value which is measured with a color difference meter (specular component included (SCI) or specular component excluded (SCE)). The color of the protective film becomes darker when the L value is smaller, whereas the color of the protective film becomes lighter and more reflective (silver colored) when the L value is large. Note that "SUSO" represents an SUS oxide film in FIG. 4.

Column (A) of FIG. 4 illustrates an L value of the resin portion 40. Columns (B) to (E) of FIG. 4 illustrate a relationship between a material of the protective film 60 and the L value. As illustrated in column (A) of FIG. 4, an L value of an epoxy resin containing carbon black or the like which is used as a material of the resin portion 40 is approximately 29.60 (SCI), and is approximately 27.81 (SCE). Such a resin portion 40 is substantially black-colored, it is easy to find scratches, corrosion, dirt, or the like in the visual inspecting step. In addition, it is less likely to fatigue the operator's eye. However, when the shield layer 50 and the protective film 60 are provided on the resin portion 40, the L value may be increased depending on the material of the protective film 60. For example, when the copper film (for example, the film thickness thereof is approximately 2.5 μm) is used as the shield layer 50, and the stainless film (for example, the film thickness thereof is approximately 0.3 μm) is used as the protective film 60, as illustrated in column (B) of FIG. 4, the L value of the surface (the protective film 60) of the semiconductor device becomes approximately 73.53 (SCI) and 70.01 (SCE), and thus the color of the semiconductor device is substantially white or silver. With such a protective film 60, it is not easy to find scratches, corrosion, dirt or the like in the visual inspecting step. In addition, it is likely to fatigue the operator's eye.

Figure 5A:
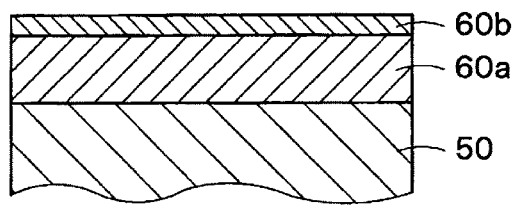
FIGS. 5A to 5C are sectional views of the protective film.
Figure 5B:
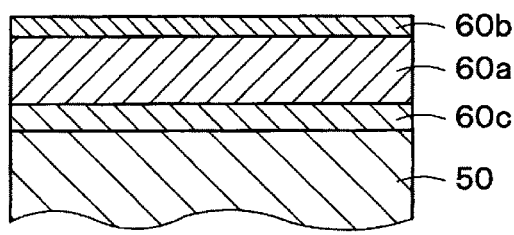

In contrast, in the semiconductor device 1 according to the exemplary embodiment, the protective film 60 contains at least one of the materials such as copper oxide, chromium oxide, iron oxide, nickel oxide, and titanium aluminum nitride. For example, in column (C) of FIG. 4, the protective film 60 is a stacked film in which an oxide film (for example, the film thickness is approximately 0.02 μm) of stainless steel is provided on a copper oxide (CuO) film (for example, the film thickness is approximately 0.42 μm). FIG. 5A is a sectional view of the protective film 60 of column (C) of FIG. 4. As illustrated in FIG. 5A, a copper oxide film 60a is provided on the shielding film 50, and an oxide film 60b of the stainless steel is provided on the copper oxide 60a. The oxide film 60b of the stainless steel is an oxide film containing iron oxide (FeO, $Fe_2O_3$), chromium oxide ($Cr_2O_3$), and nickel oxide (NiO, $Ni_2O_3$). Hereinafter, the oxide film 60b of the stainless steel is referred to as the SUS oxide film 60b. The shielding film 50 may be the copper film (for example, the film thickness is approximately 2.5 μm). In this case, the L value of the protective film 60 (the surface of the SUS oxide film 60b) is approximately 28.43 (SCI) and approximately 27.02 (SCE). That is, when the protective film 60 is the stacked film in which the copper oxide film 60a and the SUS oxide film 60b are stacked on each other, the L value becomes smaller than the L value of the resin portion 40. In this case, the surface (the protective film 60) of the semiconductor device is substantially black-colored, and it is easy to find scratches, corrosion, dirt, or the like in the visual inspecting step, and thus it is less likely to fatigue the operator's eye. Moreover, in the above example, the protective film 60 is a stacked film in which the SUS oxide film 60b is provided on the copper oxide film 60a. However, as illustrated in FIG. 5B, the protective film 60 may include a stainless steel film 60c under the copper oxide film 60a. That is, the protective film 60 may be a stacked film with three layers which include the stainless steel film 60c, the copper oxide film 60a provided on the stainless film 60c, and the SUS oxide film 60b provided on the copper oxide film 60a. Even with such a configuration, it is possible to obtain almost the same L value as the L value illustrated in column (C) of FIG. 4. Meanwhile, the stainless steel film 60c between the shielding film 50 and the copper oxide film 60a prevents oxygen in the copper oxide film 60a or the SUS oxide film 60b diffusing into the shielding film 50 and oxidizing it.

Figure 5C:
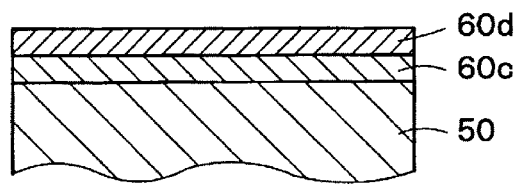

In column (D) of FIG. 4, the protective film 60 is a stacked film in which a chromium oxide ($Cr_2O_3$) film (for example, the film thickness is approximately 0.1 μm) is provided on a stainless steel film (for example, the film thickness is approximately 0.3 μm). FIG. 5C is a sectional view of the protective film 60 of column (D) of FIG. 4. As illustrated in FIG. 5C, the stainless steel film 60c is provided on the shielding film 50, and the chromium oxide film 60d is provided on the stainless steel film 60c. The stainless steel film 60c between the shielding film 50 and the chromium oxide film 60d prevents oxygen of the chromium oxide film 60d from diffusing into the shielding film 50 and oxidizing it. The shield layer 50 may be a copper film (for example, the film thickness is approximately 2.5 μm). In this case, the L value of the surface (the protective film 60) of the semiconductor device is approximately 50.57 (SCI) and 47.26 (SCE). That is, the L value of the protective film 60 becomes larger than the L value of the resin portion 40. However, the L value of the protective film 60 is considerably small as compared with the protective film 60 formed of a single-layer stainless film as illustrated in column (B) of FIG. 4. In this case, the surface (the protective film 60) of the semiconductor device is dark-colored to a certain degree, and it is possible to relatively easily find scratches, corrosion, dirt, or the like in the visual inspecting step, and thus it is less likely to fatigue the operator's eye in a relative manner.

In column (E) of FIG. 4, a material of the protective film 60 is a stacked film in which a chromium oxide ($Cr_2O_3$) film (for example, the film thickness is approximately 0.2 μm) is provided on a stainless film (for example, the film thickness is approximately 0.3 μm). The cross-section of the protective film 60 of column (E) of FIG. 4 is the same as the cross-section as illustrated in FIG. 5C except for the thickness of the chromium oxide film 60d. The stainless film 60c between the shielding film 50 and the chromium oxide film 60d prevents oxygen of the chromium oxide film 60d from diffusing into the shielding film 50 and oxidizing it. The shield layer 50 may be a copper film (for example, the film thickness is approximately 0.5 μm). In this case, the L value of the surface (the protective film 60) of the semiconductor device is approximately 57.47 (SCI) and 54.47 (SCE). That is, when the film thickness of the chromium oxide film 60d is large, the L value becomes larger. However, the L value of the protective film 60 is considerably small as compared with the protective film 60 formed of a single-layer stainless film as illustrated in column (B) of FIG. 4. In this case, the surface (the protective film 60) of the semiconductor device is dark-colored to a certain degree, and it is possible to relatively easily find scratches, corrosion, dirt, or the like in the visual inspecting step, and thus it is less likely to fatigue the operator's eye in a relative manner.

In column (F) of FIG. 4, a material of the protective film 60 is a stacked film in which a titanium aluminum nitride (TiAlN) film (for example, the film thickness is approximately 0.1 μm) is provided on a stainless steel film (for example, the film thickness is approximately 0.3 μm). The cross-section of the protective film 60 of column (F) of FIG. 4 is the same as the cross-section as illustrated in FIG. 5C except that the material of the chromium oxide film 60d is changed from the chromium oxide to the titanium aluminum nitride. The stainless steel film 60c between the shielding film 50 and the titanium aluminum nitride prevents nitrogen of the titanium aluminum nitride film from diffusing into the shielding film 50 and nitriding it. The shield layer 50 may be a copper film (for example, the film thickness is approximately 2.5 μm). In this case, the L value of the surface (the protective film 60) of the semiconductor device is approximately 28.85 (SCI) and 27.29 (SCE). That is, when the protective film 60 is the stacked film in which the copper oxide film 60a and the SUS oxide film 60b are stacked on each other, the value becomes smaller than of L value of the resin portion 40. In this case, the surface (the protective film 60) of the semiconductor device is substantially black-colored, and it is easy to find scratches, corrosion, dirt, or the like in the visual inspecting step, and thus it is less likely to fatigue the operator's eye.

As illustrated in columns (C) to (F) of FIG. 4, with regard to the L value, although there is a difference of degree, all of the protective films 60 have a smaller L value than the stainless steel film. Accordingly, the protective film 60 contains at least one of the materials such as copper oxide film 60a, the chromium oxide film 60d, the SUS oxide film (chromium oxide, iron oxide, and nickel oxide) 60b, and the titanium aluminum nitride film, and thus the L value of the protective film 60 is smaller than the L value of the stainless steel film, for example, it is possible to set the L value of the protective film 60 to be approximately equal to or smaller than 58. Thereby, it is easy to find scratches, corrosion, dirts, or the like, and thus it is possible to suppress the fatigue of the operator's eye.

In addition, the protective films 60 as illustrated in columns (C) and (F) of FIG. 4 include the L value which is the same as or smaller than the L value of the resin portion 40. Therefore, with the protective films 60 as illustrated in columns (C) and (F) of FIG. 4, the surface color of the semiconductor device is the same as or darker than that of the resin portion 40. Thus, it becomes easier to find scratches, corrosion, dirt, or the like in the visual inspecting step, and it is less likely to fatigue the operator's eye.

Next, a method for manufacturing the semiconductor device 1 according to the exemplary embodiment will be described.

Figure 6:
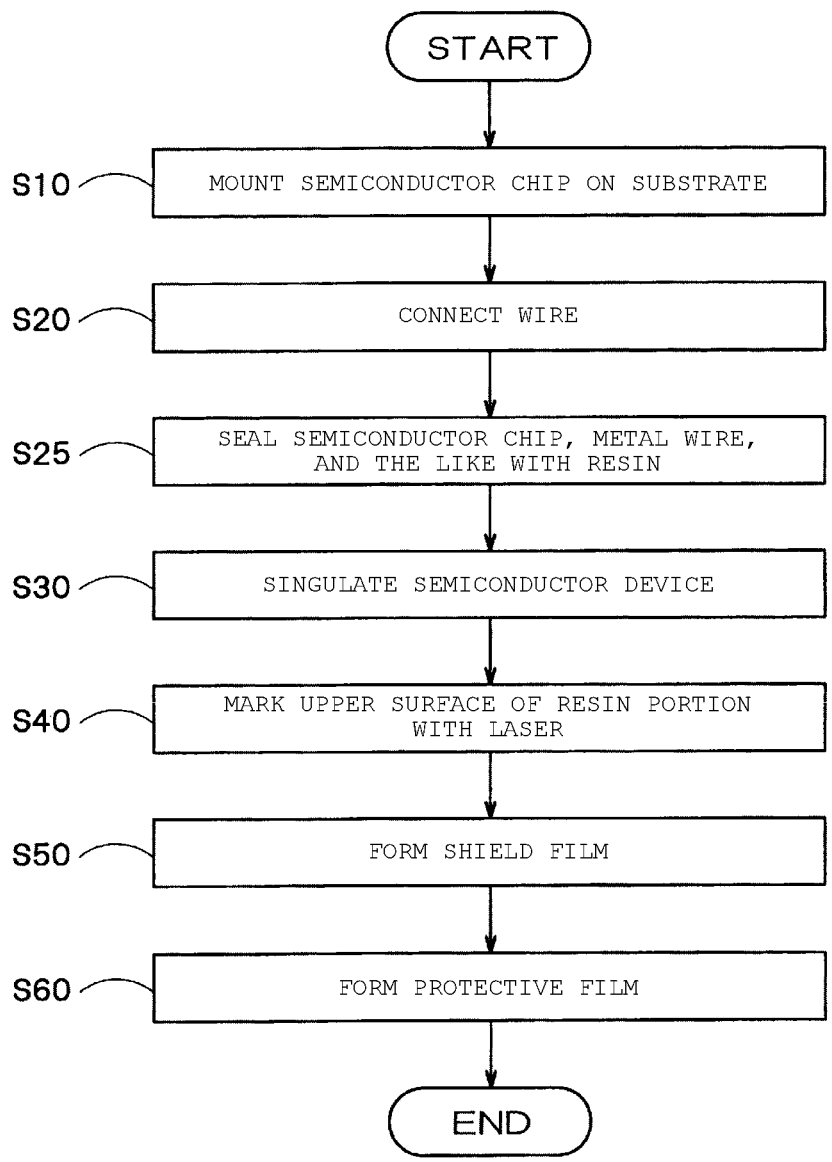
FIG. 6 is a flow diagram illustrating a method for manufacturing a semiconductor device.

FIG. 6 is a flow diagram illustrating the method for manufacturing for the semiconductor device 1. First, the semiconductor chip 20 is mounted on the substrate 10 (S10). As described above, the substrate 10 has the first surface F11, the second surface F12 formed on the side opposite to the first surface F11, and the side surface F13 between the first surface F11 and the second surface F12. The semiconductor chip 20 is mounted on the first surface F11 of the substrate 10. The semiconductor chip 20 may be a stacked body of the semiconductor chips which is formed by stacking a plurality of semiconductor chips.

Next, the electrode pad of the semiconductor chip 20 and the wiring layer 11 on the substrate 10 are electrically connected to each other via the metal wire 13 or the like (S20).

Subsequently, the resin portion 40 (for example, an epoxy resin) is molded on the first surface F11 of the substrate 10 on which the semiconductor chip 20 is mounted such that the semiconductor chip 20, the metal wire 13, and the like are sealed (S25). Examples of a method for molding the resin portion 40 include transfer molding, compression molding method, a potting method, and a printing method.

Then, the semiconductor device 1 is singulated with a dicing blade or the like (S30). At this time, the resin portion is cut out together with the substrate 10 so as to individually separate the semiconductor device 1.

Subsequently, product information such as a product name, product numbers, manufacture date, and a manufacturing plant is marked on the upper surface of the resin portion 40 of the semiconductor device 1 with a laser marking device which includes a YAG laser or the like (S40). In order to obtain a satisfactory visibility and workability, it is preferable that the product information is deeply marked, for example, in a range of from 20 µm to 40 µm in depth.

Next, the shielding film 50 is formed on the upper surface of the resin portion 40, the side surface of the resin portion 40, and the side surface of the substrate 10 (S50). The shielding film 50 as the conductive film is formed using, for example, a plating method or a sputtering method in a vacuum environment. The shielding film 50 which is provided on the upper surface of the resin portion 40 and the side surface of the resin portion 40 are electrically connected to the shielding film 50 provided on the side surface F13 of the substrate 10. In addition, the shielding film 50 which is provided on the side surface F13 of the substrate 10 is electrically connected to the first terminal 30 which can be electrically connected to the grounding potential source and the like. Thereby, it is possible that the entire shielding film 50 is electrically connected to the first terminal 30, and thus is electrically connected to the grounding potential source and the like via the first terminal 30. As a result, it is possible to prevent the electromagnetic noise from leaking to the outside of the semiconductor device 1, or to prevent the electromagnetic noise from entering the inside of the semiconductor device 1 from the outside.

Then, the protective film 60 is formed on the upper surface and the side surface of the shielding film 50 using the sputtering method or the like (S60). The protective film 60 is formed on the shielding film 50 as a metal oxide film by depositing metal on the shielding film 50 in an environment containing oxygen. In addition, the protective film 60 is formed on the shielding film 50 as a metal nitride film by depositing metal on the shielding film 50 in an environment containing nitrogen.

A case where protective film 60 is a stacked film formed of copper oxide film 60a and SUS oxide film 60b For example, as illustrated in column (C) of FIG. 4 and in FIG. 5A, when the protective film 60 is the stacked film formed of the copper oxide film 60a and the SUS oxide film 60b, first, copper (Cu) is prepared as a target, and then is sputtered onto the shielding film 50 in a mixed environment of argon (Ar) and oxygen ($O_2$). Then, a stainless steel (Fe, Cr and Ni) target is prepared, and it is sputtered on the copper oxide film in the mixed environment of argon (Ar) and oxygen ($O_2$). In this way, as the protective film 60, the stacked film formed of the copper oxide film 60a and the SUS oxide film (an oxide film containing chromium oxide, iron oxide, and nickel oxide) 60b is formed on the shielding film 50.

In this regard, the forming of the protective film 60 is performed in the vacuum environment in a forming step of the shielding film 50 while maintaining the vacuum environment. For example, the forming of the protective film 60 is performed in succession without opening the inside of a chamber (not shown), which is used in the forming step of the shielding film 50, to the air. That is, the shielding film 50 and the protective film 60 are consecutively formed in the same chamber. In this case, it is possible to consecutively form the shielding film 50 and the protective film 60 by changing the target to be sputtered without moving the substrate 10. Accordingly, before the shielding film 50 (for example, copper) is exposed to oxygen and thus naturally oxidized, the shielding film 50 is covered with the protective film 60. Thereby, it is possible to prevent the shielding film 50 from being oxidized. In addition, the substrate 10 is not moved, and thus it is possible to reduce the possibility that particles and the like are attached onto the semiconductor device 1.

Alternatively, the shielding film 50 and the protective film 60 may be formed with a plurality of chambers which have different targets. In this case, for example, the shielding film 50 is formed in the first chamber, and then the substrate 10 is moved to the second chamber from the first chamber via a transfer chamber which is maintained under vacuum. Next, the protective film 60 is formed in the second chamber. In this way, the substrate 10 is moved to the second chamber in a state where the surrounding pressure is maintained under vacuum. For this reason, when being moved to the second chamber from the first chamber, the substrate 10 can be moved in the vacuum environment without being exposed to the ambient air. Therefore, it is possible to prevent the shielding film 50 from being oxidized. In addition, in this case, there is no need to change the target in the first and second chambers, and thus it is possible to save the time and effort to change the target.

Further, also in the forming step of the protective film 60, the forming of the copper oxide film and the SUS oxide film may be performed by changing the target in the same chamber. In this case, it is possible to stack the copper oxide film and the SUS oxide film without moving the substrate 10. In addition, the substrate 10 is not moved, and thus it is possible to reduce the possibility that particles and the like are attached onto the semiconductor device 1.

Alternatively, the copper oxide film and the SUS oxide film may be formed with a plurality of chambers which have different targets. In this case, for example, the copper oxide film is formed in the first chamber, and then the substrate 10 is moved to the second chamber from the first chamber via a transfer chamber which is maintained under vacuum. Next, the SUS oxide film is formed in the second chamber. In this way, the substrate 10 is moved to the second chamber in a state where the surrounding pressure is maintained under vacuum. For this reason, when being moved to the second chamber from the first chamber, the substrate 10 is movable in a vacuum environment without being exposed to the ambient air. In addition, there is no need to change the target in the first and second chambers, and thus it is possible to save the time and effort to change the target.

The film thickness of each of the shielding film 50 and the protective film 60 is smaller than the depth and width of the information marked on the resin portion 40. Although the shielding film 50 and the protective film 60 are provided on the upper surface of the resin portion 40 as described, the operator can visually confirm the information marked.

As illustrated in FIG. 5B, when the stainless steel film 60c is formed between the shielding film 50 and the copper oxide film 60a, the stainless film 60c may be also formed on the shielding film 50 in a state where the vacuum environment around the substrate 10 is maintained. Thereafter, the copper oxide film 60a and the SUS oxide film 60b are also formed on the stainless film 60c in a state where the vacuum environment around the substrate 10 is maintained.

A case where protective film 60 is stacked film formed of stainless film 60c and chromium oxide film 60d For example, as illustrated in columns (D) and (E) of FIG. 4, when the protective film 60 is the stacked film formed of the stainless steel film and the chromium oxide film, first, a material (Fe, Cr, or Ni) of the stainless steel film is prepared as a target, and then is subjected to the sputtering on the shielding film 50 in the mixed atmosphere of argon (Ar) and oxygen ($O_2$). Then, chrome is prepared as a target, and is sputtered onto the stainless steel film in the mixed atmosphere of argon (Ar) and oxygen ($O_2$). In this way, as the protective film 60, the stacked film formed of the stainless steel film and the chromium oxide film is formed on the shielding film 50.

As described, the forming of the protective film 60 is performed in the vacuum environment in the forming step of the shielding film 50 while maintaining the vacuum environment. Thereby, it is possible to prevent the shielding film 50 from being oxidized.

In the forming step of the protective film 60, the forming of the stainless steel film and the chromium oxide film may be performed by changing the target in the same chamber. In this case, the substrate 10 is not moved, and thus it is possible to reduce the possibility that particles and the like are attached onto the semiconductor device 1. Alternatively, the stainless steel film and the chromium oxide film may be formed with a plurality of chambers which have different targets. When being moved to the second chamber from the first chamber, the substrate 10 can be moved in the vacuum environment without being exposed to the ambient air. In this case, there is no need to change the target in the first and second chambers, and thus it is possible to save the time and effort to change the target.

A case where protective film 60 is stacked film formed of stainless film 60c and titanium aluminum nitride For example, when the protective film 60 is the stacked film formed of the stainless steel film and the titanium aluminum nitride, first, a material (Fe, Cr, or Ni) of the stainless steel film is prepared as a target, and then is subjected to the sputtering onto the shielding film 50 in the mixed atmosphere of argon (Ar) and oxygen ($O_2$). Then, a titanium aluminum alloy is prepared as a target, and is sputtered onto the stainless steel film while being plasma-nitrided in a mixed atmosphere of argon (Ar) and nitrogen ($N_2$). In this way, as the protective film 60, the stacked film formed of the stainless film and the titanium aluminum nitride film is formed on the shielding film 50.

As described, the forming of the protective film 60 is performed in the vacuum environment in the forming step of the shielding film 50 while maintaining the vacuum environment. Thereby, it is possible to prevent the shielding film 50 from being oxidized.

In the forming of the protective film 60, the stainless steel film and the titanium aluminum nitride film may be formed by changing the target in the same chamber. In this case, the substrate 10 is not moved, and thus it is possible to reduce the possibility that particles and the like are attached onto the semiconductor device 1. Alternatively, the stainless steel film and the titanium aluminum nitride may be formed with a plurality of chambers which have different targets. When being moved to the second chamber from the first chamber, the substrate 10 can be moved in the vacuum environment without being exposed to the ambient air. In this case, there is no need to change the target in the first and second chambers, and thus it is possible to save the time and effort to change the target.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    providing a substrate having a first surface, a second surface opposite to the first surface, and a side surface between the first surface and the second surface;
    providing a semiconductor chip on the first surface;
    forming a resin portion that seals the semiconductor chip;
    forming a conductive film on an upper surface of the resin portion and a side surface of the resin portion, the conductive film being electrically connectable to a ground potential source; and
    forming a film stack including a first film that is a metal oxide film formed by depositing metal in an oxygen containing environment or a metal nitride film formed by depositing metal in a nitrogen containing environment, wherein
    a lightness value of the film stack is less than a lightness value of the resin portion.

2. The method according to claim 1, wherein
    the conductive film contains at least one of copper, chrome, iron, nickel, titanium, and aluminum, and
    the first film is the metal oxide film and the metal oxide film contains at least one of copper oxide, chromium oxide, iron oxide, and nickel oxide.

3. The method according to claim 2, wherein the film stack further includes a second film that is titanium aluminum nitride.

4. The method according to claim 1, wherein the conductive film is formed in a vacuum environment, and the first film of the film stack is formed in the vacuum environment used in forming the conductive film.

5. The method according to claim 1, wherein the conductive film and the first film of the film stack are formed in the same chamber.

6. The method according to claim 1, wherein
the conductive film is formed in a first vacuum chamber,
the substrate is moved under vacuum to a second chamber, and
the first film of the film stack is formed in the second chamber.

7. The method according to claim 1, wherein
the first film of the film stack is the metal oxide film, and
the first film is formed on the conductive film by sputtering a metal while the metal is being plasma-oxidized.

8. The method according to claim 1, wherein
the film stack further includes a second film that is an oxide of stainless steel film, and
the first film of the film stack is a copper oxide film.

9. The method according to claim 1, wherein forming the film stack further includes forming a stainless steel film on the conductive film.

10. The method according to claim 9, wherein
the film stack further includes an oxide stainless steel film, and
the first film is a copper oxide film.

11. The method according to claim 9, wherein the first film of the film stack is a chromium oxide film.

12. The method according to claim 1, wherein the first film of the film stack is the metal nitride film, and the first film is formed on the conductive film by sputtering a metal while the metal is being plasma-nitrided.

* * * * *